(12) United States Patent
Huang et al.

(10) Patent No.: US 10,825,804 B2
(45) Date of Patent: *Nov. 3, 2020

(54) HOLLOW METAL PILLAR PACKAGING SCHEME

(71) Applicant: Taiwan Semiconductor Manufacturing Company, Ltd., Hsinchu (TW)

(72) Inventors: Chang-Pin Huang, Yangmei Township (TW); Hsien-Ming Tu, Zhubei (TW); Hsien-Wei Chen, Hsinchu (TW); Tung-Liang Shao, Hsinchu (TW); Ching-Jung Yang, Pingzhen (TW); Yu-Chia Lai, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/511,454

(22) Filed: Jul. 15, 2019

(65) Prior Publication Data

US 2019/0341377 A1  Nov. 7, 2019

Related U.S. Application Data

(60) Continuation of application No. 15/783,619, filed on Oct. 13, 2017, now Pat. No. 10,354,986, which is a
(Continued)

(51) Int. Cl.
*H01L 23/48* (2006.01)
*H01L 23/52* (2006.01)
(Continued)

(52) U.S. Cl.
CPC .............. *H01L 25/50* (2013.01); *H01L 21/56* (2013.01); *H01L 21/566* (2013.01); *H01L 23/3192* (2013.01); *H01L 23/562* (2013.01); *H01L 24/11* (2013.01); *H01L 24/13* (2013.01); *H01L 24/81* (2013.01); *H01L 25/0657* (2013.01); *H01L 23/293* (2013.01); *H01L 2224/03914* (2013.01); *H01L 2224/0401* (2013.01); *H01L 2224/05008* (2013.01); *H01L 2224/05548* (2013.01); *H01L 2224/05567* (2013.01); *H01L 2224/05647* (2013.01); *H01L 2224/1134* (2013.01); *H01L 2224/1147* (2013.01); *H01L 2224/1181* (2013.01); *H01L 2224/1182* (2013.01); *H01L 2224/1191* (2013.01);
(Continued)

(58) Field of Classification Search
CPC ................. H01L 21/56; H01L 2224/97; H01L 2224/0237; H01L 2224/05548; H01L 2224/05008; H01L 2224/13011; H01L 2225/06541; H01L 2225/1058; H01L 23/481
USPC ........ 257/692, 693, 697, 698, 773, 774, 778
See application file for complete search history.

(56) References Cited

U.S. PATENT DOCUMENTS 6,239,016 B1  5/2001  Ishikawa
7,700,986 B2  4/2010  Huang et al.
(Continued)

*Primary Examiner* — S. V. Clark
(74) *Attorney, Agent, or Firm* — Slater Matsil, LLP

(57) ABSTRACT

An integrated circuit includes a bottom substrate, a metal layer disposed over the bottom substrate and a hollow metal pillar disposed on the metal layer. The metal layer and the hollow metal pillar are electrically connected.

20 Claims, 5 Drawing Sheets

Related U.S. Application Data continuation of application No. 15/614,096, filed on Jun. 5, 2017, now Pat. No. 9,812,434, which is a continuation of application No. 15/095,765, filed on Apr. 11, 2016, now Pat. No. 9,679,883, which is a division of application No. 14/030,157, filed on Sep. 18, 2013, now Pat. No. 9,343,417.

(51) Int. Cl.

| | | |
|---|---|---|
| *H01L 29/40* | (2006.01) | |
| *H01L 25/00* | (2006.01) | |
| *H01L 23/00* | (2006.01) | |
| *H01L 23/31* | (2006.01) | |
| *H01L 21/56* | (2006.01) | |
| *H01L 25/065* | (2006.01) | |
| *H01L 23/29* | (2006.01) | |

(52) U.S. Cl.
CPC ........... *H01L 2224/11462* (2013.01); *H01L 2224/13005* (2013.01); *H01L 2224/13011* (2013.01); *H01L 2224/13012* (2013.01); *H01L 2224/13016* (2013.01); *H01L 2224/13022* (2013.01); *H01L 2224/13024* (2013.01); *H01L 2224/13111* (2013.01); *H01L 2224/13124* (2013.01); *H01L 2224/13139* (2013.01); *H01L 2224/13147* (2013.01); *H01L 2224/14131* (2013.01); *H01L 2224/16145* (2013.01); *H01L 2224/16148* (2013.01); *H01L 2224/16225* (2013.01); *H01L 2224/16227* (2013.01); *H01L 2224/81193* (2013.01); *H01L 2224/81411* (2013.01); *H01L 2224/81815* (2013.01); *H01L 2225/06513* (2013.01); *H01L 2924/014* (2013.01); *H01L 2924/01008* (2013.01); *H01L 2924/01018* (2013.01); *H01L 2924/181* (2013.01); *H01L 2924/351* (2013.01)

(56) References Cited

U.S. PATENT DOCUMENTS

| | | | |
|---|---|---|---|
| 8,519,472 | B2 | 8/2013 | Jeong et al. |
| 8,847,372 | B1 | 9/2014 | Darveaux et al. |
| 8,901,726 | B2 | 12/2014 | Lin et al. |
| 8,941,244 | B1 * | 1/2015 | Tsai ............... H01L 21/486 257/664 |
| 10,354,986 | B2 * | 7/2019 | Huang ............... H01L 24/11 |
| 10,566,279 | B2 * | 2/2020 | Lu ..................... H01L 24/85 |
| 2009/0072398 | A1 | 3/2009 | Irsigler et al. |
| 2010/0013068 | A1 | 1/2010 | Huang et al. |
| 2011/0266670 | A1 | 11/2011 | England et al. |
| 2013/0119546 | A1 | 5/2013 | Oshima |
| 2013/0119549 | A1 | 5/2013 | Cheng et al. |
| 2013/0161787 | A1 | 6/2013 | Kim et al. |
| 2013/0241071 | A1 | 9/2013 | Hsieh |
| 2013/0299967 | A1 | 11/2013 | Daniels et al. |
| 2014/0203438 | A1 | 7/2014 | Chen et al. |
| 2015/0076689 | A1 | 3/2015 | Huang et al. |
| 2015/0200166 | A1 | 7/2015 | Kono et al. |
| 2015/0228556 | A1 | 8/2015 | Lee et al. |
| 2015/0287688 | A1 | 10/2015 | Lin et al. |
| 2015/0348991 | A1 | 12/2015 | Simsek-Ege et al. |
| 2016/0005707 | A1 | 1/2016 | Kwon et al. |
| 2019/0242942 | A1 * | 8/2019 | Hsu ................... G01R 31/2889 |

\* cited by examiner

HOLLOW METAL PILLAR PACKAGING SCHEME

PRIORITY CLAIM AND CROSS-REFERENCE

This application is a continuation and claims the benefit of U.S. patent application Ser. No. 15/783,619, filed on Oct. 13, 2017, entitled "Hollow Metal Pillar Packaging Scheme," which is a continuation and claims the benefit of U.S. patent application Ser. No. 15/614,096, filed on Jun. 5, 2017, now U.S. Pat. No. 9,812,434, issued on Nov. 7, 2017, entitled "Hollow Metal Pillar Packaging Scheme," which is a continuation of U.S. patent application Ser. No. 15/095,765, filed on Apr. 11, 2016, now U.S. Pat. No. 9,679,883, issued on Jun. 13, 2017, entitled "Hollow Metal Pillar Packaging Scheme," which is a divisional of U.S. patent application Ser. No. 14/030,157, filed on Sep. 18, 2013, now U.S. Pat. No. 9,343,417, issued on May 17, 2016, entitled "Hollow Metal Pillar Packaging Scheme," which applications are incorporated herein by reference.

TECHNICAL FIELD

The present disclosure relates generally to an integrated circuit and more particularly a hollow metal pillar packaging scheme.

BACKGROUND

For integrated circuit packaging, board level thermal cycling tests are used to test the wafer level package. One failure mechanism is solder ball cracks from thermal stress which may cause electrical connection failure. Such cracks result from the mismatch of coefficient of thermal expansion (CTE). A packaging scheme more resistant to thermal stress is desirable.

BRIEF DESCRIPTION OF THE DRAWINGS

Reference is now made to the following descriptions taken in conjunction with the accompanying drawings, in which:

FIG. 1A is a cross section view of an exemplary hollow metal pillar package according to some embodiments;

DETAILED DESCRIPTION

Figure 1B:
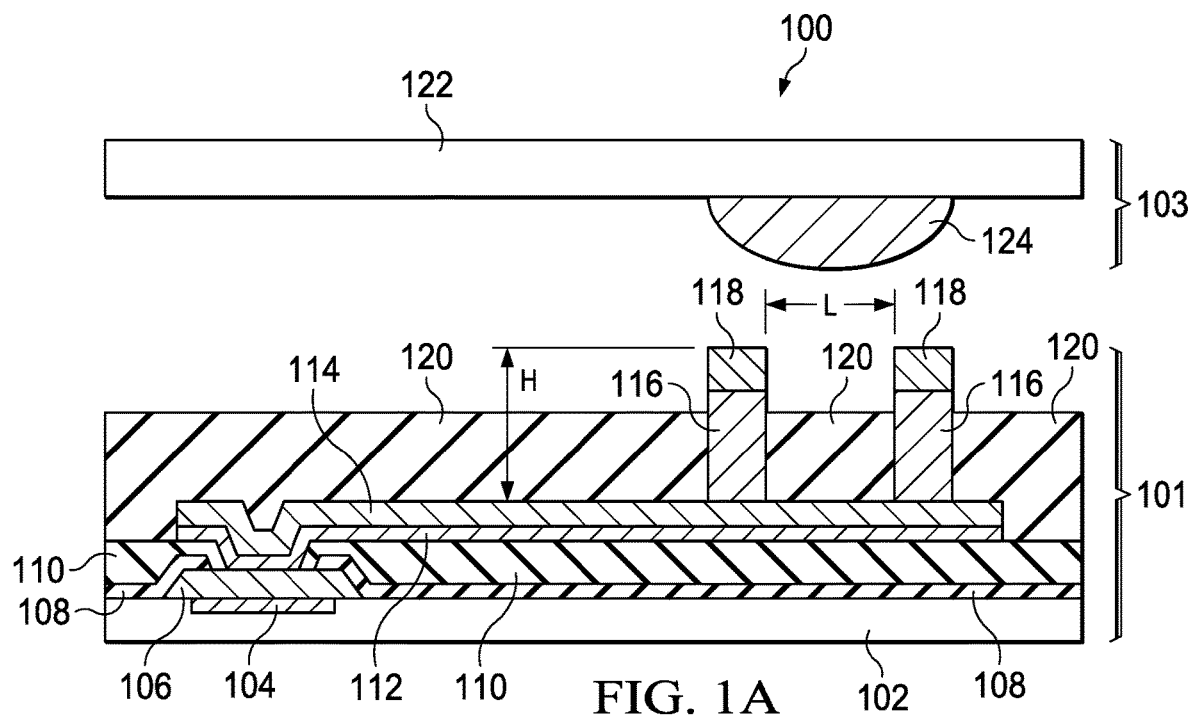
FIGS. 1B-1C are top views of exemplary hollow metal pillars according to some embodiments.
Figure 1B:
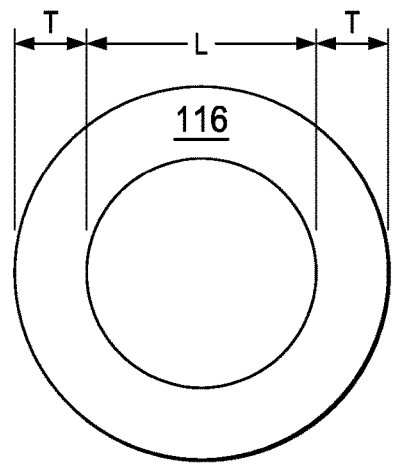

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a cross section view of an exemplary hollow metal pillar package 100 according to some embodiments. The hollow metal pillar package 100 includes a bottom package 101 and a top package 103. The bottom package 101 includes a bottom substrate 102, a metal layer 104, a contact pad 106, passivation layers 108 and 110, a seed layer 112 and a metal layer 114 (e.g., a redistribution layer), a hollow metal pillar 116, solder layer 118, and a stress buffer layer 120. The top package 103 includes a top substrate 122 and a solder pad 124.

The bottom substrate 102 and the top substrate 122 comprise silicon, silicon dioxide, aluminum oxide, sapphire, germanium, gallium arsenide (GaAs), an alloy of silicon and germanium, indium phosphide (InP), silicon on insulator (SOI), or any other suitable material. The metal layer 104 is patterned for electrical wiring and comprises copper, aluminum, or any other suitable material. The contact pad 106 provides electrical connections and comprises copper, aluminum, or any other suitable material.

The passivation layers 108 and 110 provide insulation and protection for the surface below. In some embodiments, the passivation layer 108 comprises SiN/SiO and the passivation layer 110 comprises polymer material such as polybenzoxazole (PBO). The seed layer 112 facilitates the formation of the metal layer 114 (i.e., redistribution layer) above, and comprises copper with the metal layer 114 comprising copper in some embodiments.

The hollow metal pillar 116 provides electrical connection between the top package 103 and the bottom package 101. The hollow metal pillar 116 has a better thermal and electrical conductivity and reduced electromigration compared to a conventional solder ball.

The hollow metal pillar 116 comprises copper, aluminum, or any other suitable material. In some embodiments, the hollow metal pillar 116 has a height H of 80 μm-90 μm, an inner diameter L of 140 μm-160 μm, and a thickness T of about 40 μm-50 μm. In other embodiments, the size and dimension can be varied depending on applications.

The hollow metal pillar 116 provides proper standoff distance (height) between bottom substrate 102 and the top substrate 122, which also helps to have better temperature control. In one example, the hollow metal pillar 116 has a height of 90 μm due to a process specification. For example, some fabrication process using liquid molding compound (LMC) as the stress buffer layer 120 has a minimum thickness of 80 μm for the stress buffer layer 120, and the hollow metal pillar 116 should be higher than the stress buffer layer 120 for proper electrical connection.

The stress buffer layer 120 provides structural protection from stress and comprises liquid molding compound (LMC) in some embodiments. The stress buffer layer 120 increases the life time of the structure in the thermal cycle test by reducing the impact of coefficient of thermal expansion (CTE) mismatch of materials around the hollow metal pillar 116.

The hollow metal pillar 116 is higher than the stress buffer layer 120 by about 10 µm to ensure proper electrical contact with the solder pad 124 when the top package 103 is mounted on the bottom package 101 in some embodiments. The solder layer 118 and the solder pad 124 comprise SnAg or any other suitable material. The solder layer 118 has a height of about 10 µm-20 µm in some embodiments.

The hollow metal pillar package 100 saves cost and also provides better temperature cycle test results in life time cycle compared to other packaging schemes. The hollow metal pillar 116 has a better thermal and electrical conductivity and reduced electromigration compared to a conventional solder ball.

A person skilled in the art will understood that the top package 103 is simplified in FIG. 1A, and may have additional layers and features similar to the bottom package 101, such as metal layers, passivation layers, etc. Also, both the top package 103 and the bottom package 101 may include any other devices and components such as transistors, resistors, inductors, and capacitors among others.

Figure 1C:
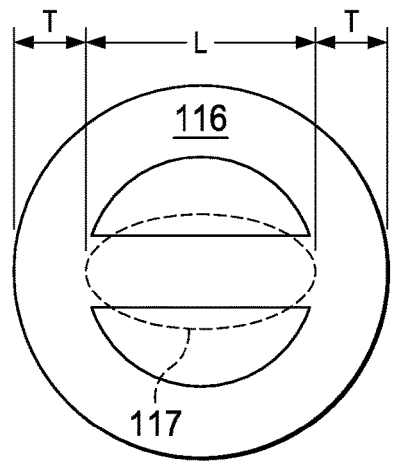

FIGS. 1B-1C are top views of exemplary hollow metal pillars 116 according to some embodiments. In FIG. 1B, the hollow metal pillar 116 has a cylindrical structure with a circular shape top view. In FIG. 1C, the hollow metal pillar 116 has a cylindrical structure with an inside divider 117 added to a circular shape in the top view. The inside divider 117 may increase the life time of the structure in the thermal cycle test for some embodiments.

The inside divider 117 provides better thermal conductivity (i.e., heat transfer) and may be aligned in the direction of coefficient of thermal expansion (CTE) mismatch. In other embodiments, the inside divider 117 may be arranged in a different shape, such as a cross shape with two lines crossing each other (i.e., "+" shape) instead of the one line shape (i.e., "−" shape).

In some embodiments, the hollow metal pillar 116 has a height H of about 80 µm-90 µm, an inner diameter L of 140 µm-160 µm, and a thickness T of about 40 µm-50 µm. In other embodiments, the size and dimension can be varied depending on applications.

Figure 2:
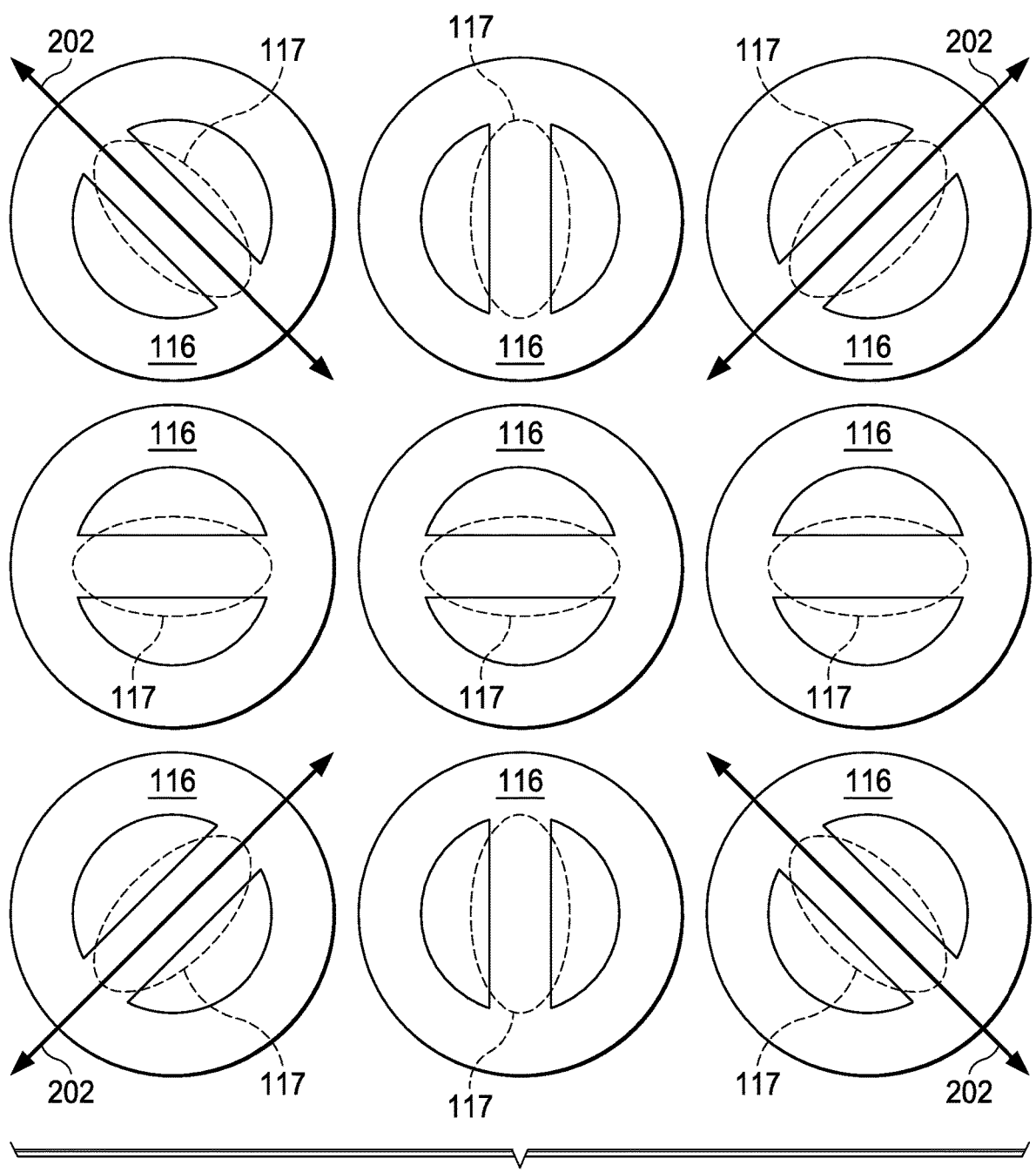
FIG. 2 is a top view of an exemplary arrangement of hollow metal pillars with inside dividers according to some embodiments.

FIG. 2 is a top view of an exemplary arrangement of hollow metal pillars 116 with inside dividers 117 according to some embodiments. The arrows 202 show the direction of CTE mismatch and the inside dividers 117 are aligned in the direction of the CTE mismatch. In other embodiments, the inside dividers 117 can be aligned to other directions depending on applications.

Figure 3A:
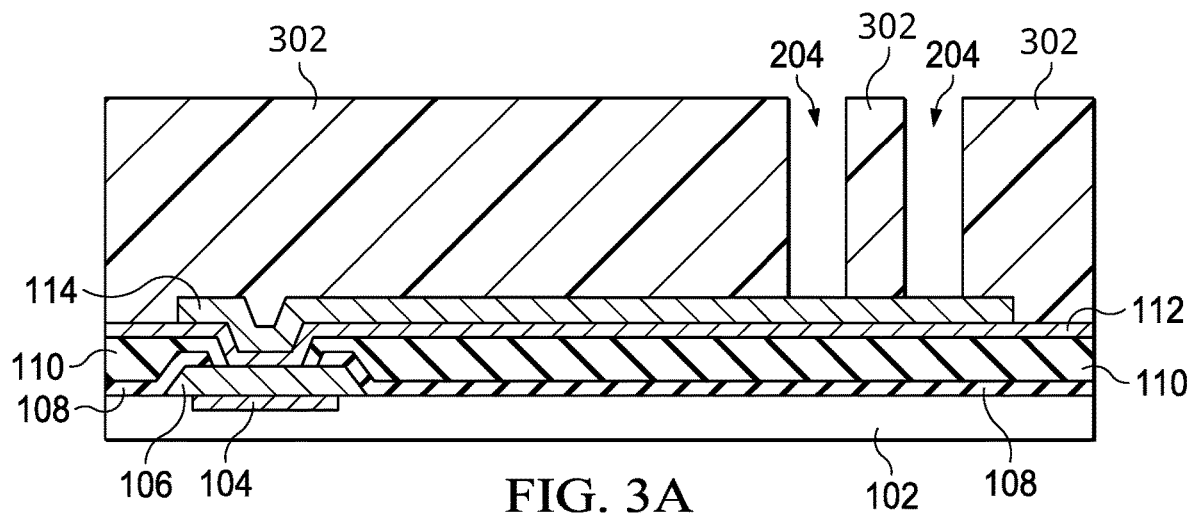
FIGS. 3A-3I are exemplary intermediate fabrication steps of the exemplary hollow metal pillar package in FIG. 1A according to some embodiments.

FIGS. 3A-3I are exemplary intermediate fabrication steps of the exemplary hollow metal pillar package in FIG. 1A according to some embodiments. In FIG. 3A, a photoresist 302 is deposited over the bottom substrate 102 and openings 204 for the hollow metal pillar 116 are formed by a photolithography process. The metal layer 104, the contact pad 106, passivation layers 108 and 110, the seed layer 112 and the metal layer 114 (e.g., a redistribution layer) can be formed by any known method in the art.

Figure 3B:
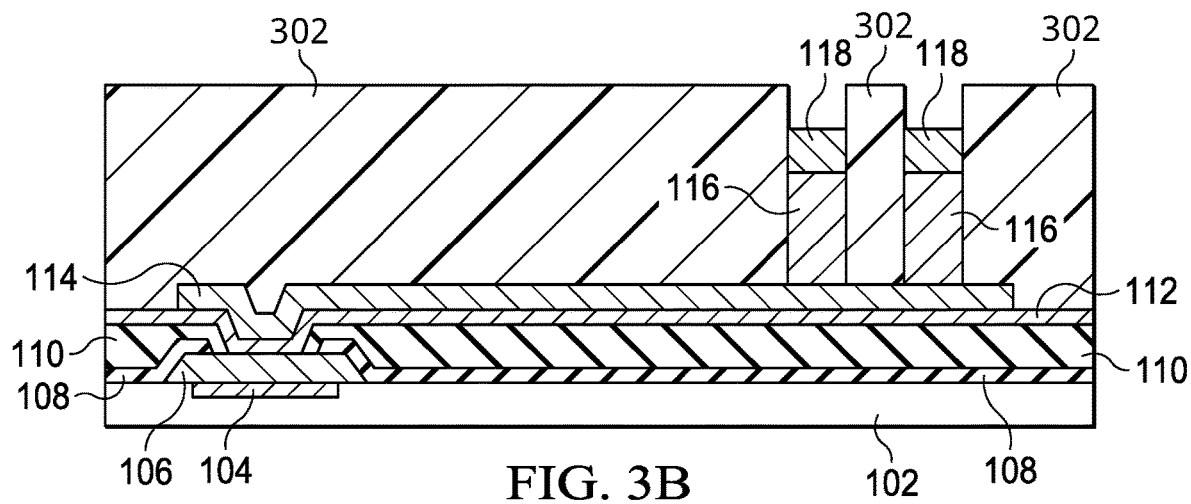

In FIG. 3B, the hollow metal pillar 116 and the solder layer 118 are deposited in the openings 204 by electroplating process, for example. In some embodiments, plasma cleaning such as $O_2$ plasma process can be performed prior to the deposition. The hollow metal pillar 116 comprises copper, aluminum, or any other suitable material. In some embodiments, the hollow metal pillar 116 has a height H of about 80 µm-90 µm, an inner diameter L of 140 µm-160 µm, and a thickness T of about 40 µm-50 µm. In other embodiments, the size and dimension can be varied depending on applications.

The hollow metal pillar 116 provides electrical connection between the top package 103 and the bottom package 101 in FIG. 1A. The hollow metal pillar 116 has a better thermal and electrical conductivity and reduced electromigration compared to a conventional solder ball. The solder layer 118 comprises SnAg or any other suitable material. The solder layer 118 has a height of about 10 µm-20 µm in some embodiments.

Figure 3C:
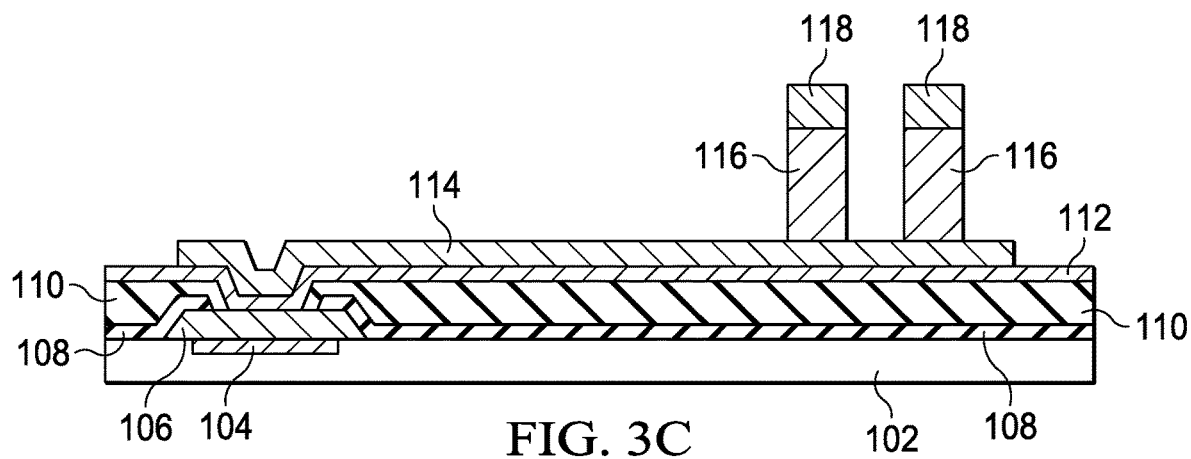

In FIG. 3C, the photoresist 302 is removed by a wet etching process, for example.

Figure 3D:
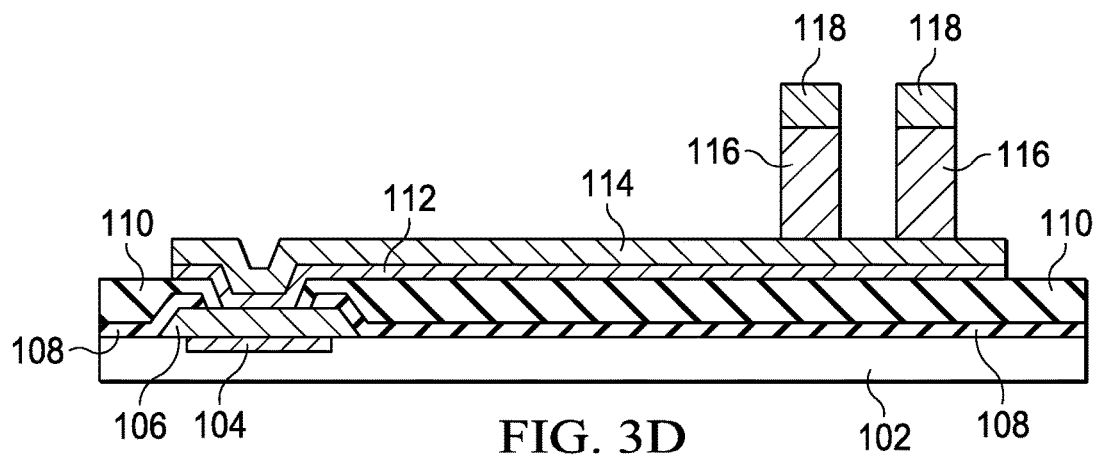

In FIG. 3D, the seed layer 112 outside of the metal layer 114 is removed by an etching process, for example.

Figure 3E:
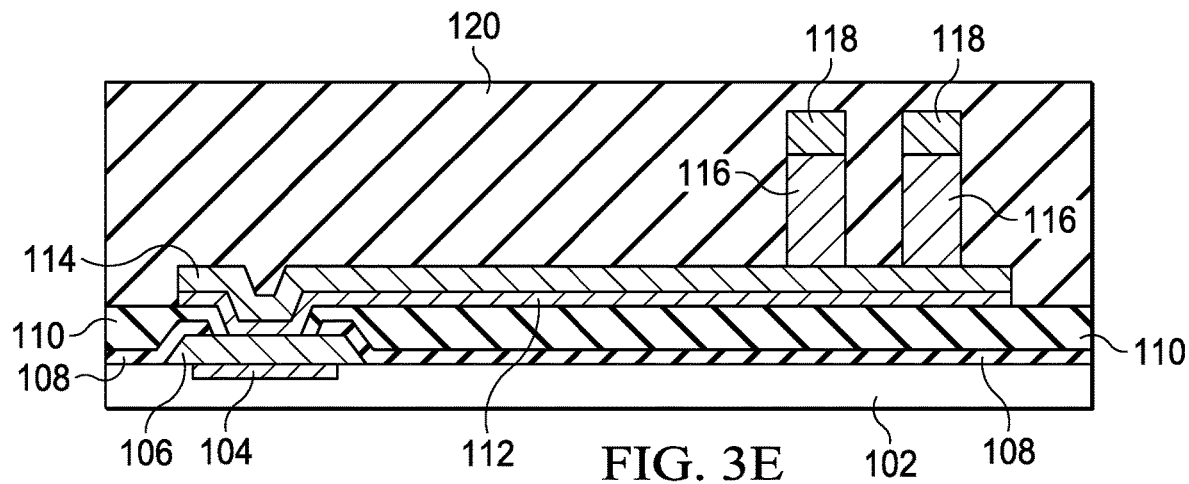

In FIG. 3E, the stress buffer layer 120 (e.g., liquid molding compound) is formed over the metal layer 114, the hollow metal pillar 116 and the solder layer 118 by coating, for example. The stress buffer layer 120 comprises polymer in some embodiments.

Figure 3F:
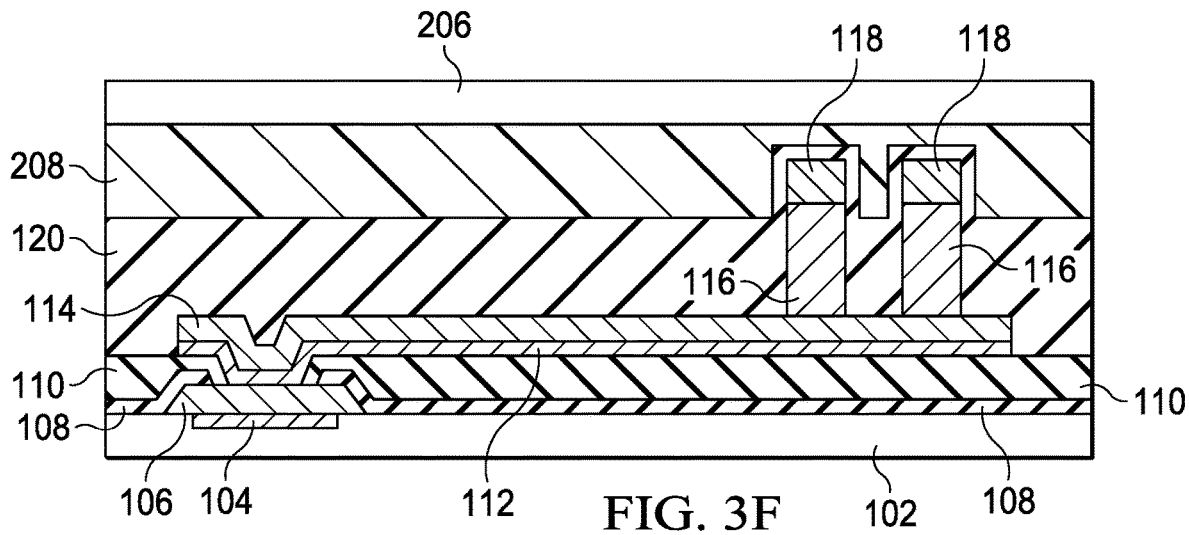

In FIG. 3F, a release film 208 mounted on a carrier 206 is pressed on the stress buffer layer 120. In some embodiments, the release film 208 comprises polymer material and has a thickness of about 100 µm. In some embodiments, the release film 208 is pressured with about 300 kN clamping force and the stress buffer layer 120 is cured with a thermal process for about 7 minutes at about 150° C. temperature.

Figure 3G:
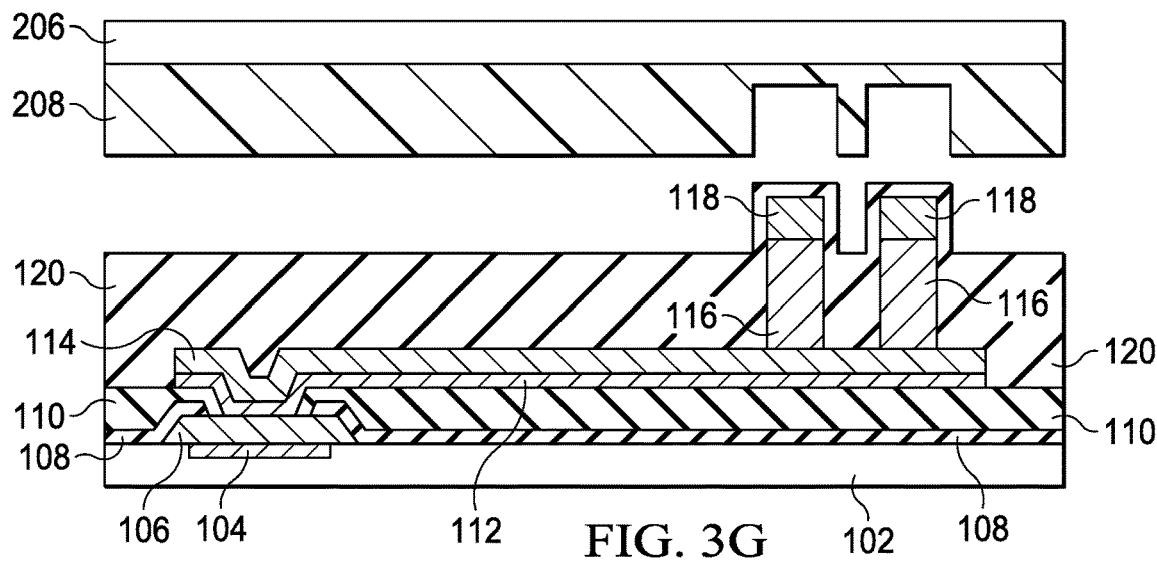

In FIG. 3G, the release film 208 is removed.

Figure 3H:
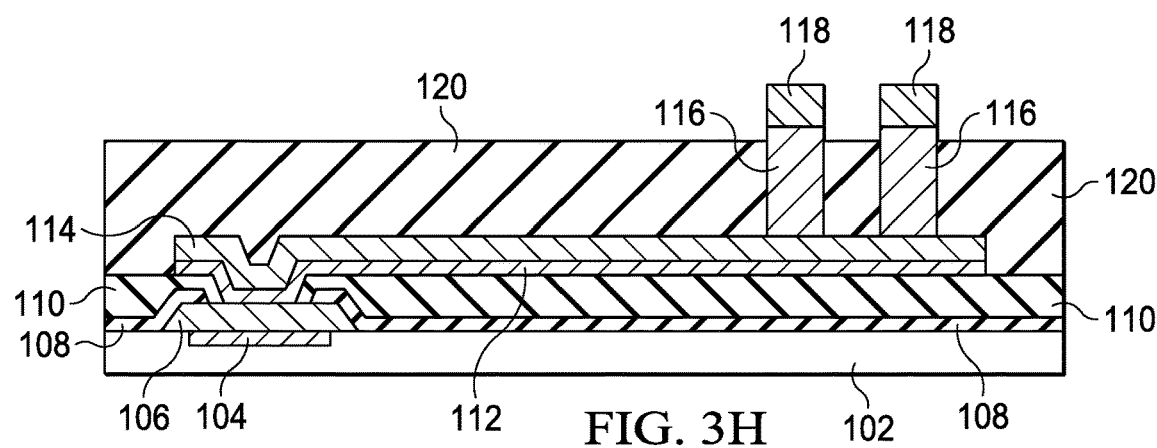

In FIG. 3H, the stress buffer layer 120 is plasma cleaned to expose the solder layer 118 and the top portion of the hollow metal pillar 116. In some embodiments, the plasma cleaning uses $Ar/O_2$ for 60 seconds.

Figure 3I:
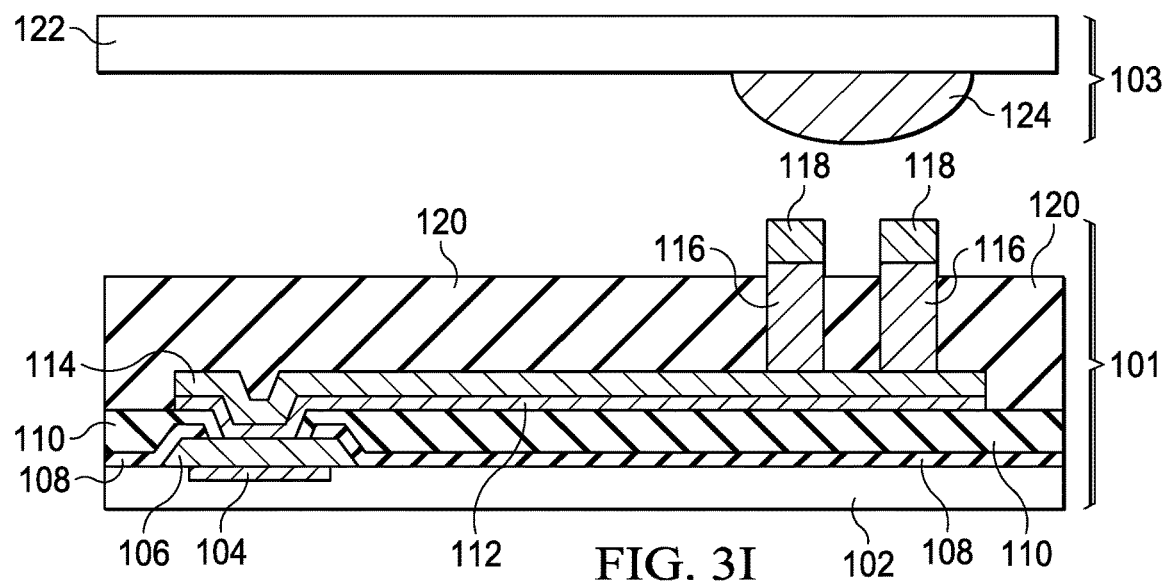

In FIG. 3I, the top package 103 including the top substrate 122 and the solder pad 124 is mounted to the bottom package 101 with the solder layer 118. Then the solder pad 124 and solder layer 118 are reflowed to electrically connect the top package 103 and the hollow metal pillar 116 of the bottom package 101 in some embodiments.

According to some embodiments, an integrated circuit includes a bottom substrate, a metal layer disposed over the bottom substrate and a hollow metal pillar disposed on the metal layer. The metal layer and the hollow metal pillar are electrically connected.

According to some embodiments, a method includes forming a metal layer over a bottom substrate. A hollow metal pillar is formed on the metal layer. The metal layer and the hollow metal pillar are electrically connected.

A skilled person in the art will appreciate that there can be many embodiment variations of this disclosure. Although the embodiments and their features have been described in detail, it should be understood that various changes, substitutions, and alterations can be made herein without departing from the spirit and scope of the embodiments. Moreover, the scope of the present application is not intended to be limited to the particular embodiments of the process, machine, manufacture, and composition of matter, means, methods, and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

In one aspect, embodiments described herein may provide for a method that includes forming a metal layer over a bottom substrate, forming a hollow metal pillar on the metal layer, wherein the metal layer and the hollow metal pillar are electrically connected.

In another aspect, embodiments described herein may provide for a method that includes forming a patterning layer over a package structure having a conductor thereon, the patterning layer having an annular pattern exposing a portion of the conductor, and depositing a first conductive material within the annular pattern. The method further includes depositing a second conductive material within the annular pattern and on the first conductive material, and removing the patterning layer.

In yet other aspects, embodiments described herein may provide for a method that includes forming a hollow metal pillar on a metal layer of a first device, wherein the metal layer and the hollow metal pillar are electrically connected, encapsulating the hollow metal pillar in a stress buffer material, and removing an upper surface of the stress buffer material to expose an upper surface of the hollow metal pillar.

In an embodiment, a method includes: forming a conductive layer over a first substrate; forming a mask layer over the conductive layer; patterning the mask layer to form an opening in the mask layer, the opening exposing a portion of the conductive layer, the opening having an annular shape in a plan view; depositing a first conductive material in the opening; depositing a second conductive material in the opening and over the first conductive material, the second conductive material being different from the first conductive material; removing the mask layer; depositing a molding compound over the first conductive material and the second conductive material; and removing a portion of the molding compound to expose a sidewall of the first conductive material, and a sidewall and a top surface of the second conductive material.

In another embodiment, a method includes: forming a conductive layer over a first substrate; forming a mask layer over the conductive layer; patterning the mask layer to form a first opening in the mask layer, the first opening exposing a first portion of the conductive layer, the first opening having an annular shape in a plan view; depositing a conductive material in the first opening; removing the mask layer to form a second opening in the conductive material, the second opening exposing a second portion of the conductive layer, the second portion of the conductive layer being different from the first portion of the conductive layer; and filling the second opening with a molding compound.

In yet another embodiment, a method includes: forming a metal layer over a first substrate; forming a photoresist layer over the metal layer; patterning the photoresist layer to form a first opening in the photoresist layer, the first opening having an annular shape in a plan view; depositing a metallic material in the first opening, the metallic material being in electrical contact with the metal layer; removing the photoresist layer to form one or more second openings in the metallic material; depositing an insulating material over the metallic material, the insulating material filling the one or more second openings; and removing a portion of the insulating material to expose sidewalls of the one or more second openings.

In yet another embodiment, a structure includes: a substrate; a redistribution layer over the substrate; a conductive pillar over the redistribution layer, the conductive pillar having an annular shape in a plan view; and an insulating material extending along an inner sidewall and an outer sidewall of the conductive pillar.

In yet another embodiment, a structure includes: a substrate; a redistribution layer over the substrate; a molding compound over the redistribution layer; and a conductive pillar in the molding compound, the conductive pillar surrounding a portion of the molding compound, the conductive pillar being electrically coupled to the redistribution layer.

In yet another embodiment, a structure includes: a substrate; a contact pad over the substrate; a passivation layer over the contact pad; a redistribution layer over the passivation layer, a portion of the redistribution layer extending through the passivation layer and contacting the contact pad; a molding compound over the redistribution layer; and a conductive pillar extending into the molding compound and contacting the redistribution layer, the conductive pillar having a shape of a hollow cylinder.

In yet another embodiment, a structure includes: a substrate; a redistribution layer over the substrate; and a conductive pillar over the redistribution layer, the conductive pillar having an annular shape in a plan view, where the annular shape includes two holes and a divider separating the two holes.

In yet another embodiment, a structure includes: a substrate; a redistribution layer over the substrate; and a conductive pillar in electrical contact with the redistribution layer, the conductive pillar having a shape of a cylindrical shell, the cylindrical shell having a divider extending from a first portion of an inside sidewall of the cylindrical shell to a second portion of the inside sidewall of the cylindrical shell.

In yet another embodiment, a structure includes: a substrate; a contact pad over the substrate; a passivation layer over the contact pad; a redistribution layer over the passivation layer, a portion of the redistribution layer extending through the passivation layer and contacting the contact pad; and a conductive pillar in physical contact with the redistribution layer, the conductive pillar having a shape of a hollow cylinder, the hollow cylinder having a divider extending from a first portion of an inside sidewall of the hollow cylinder to a second portion of the inside sidewall of the hollow cylinder.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:
1. A structure comprising:
a substrate;
a redistribution layer over the substrate; and
a conductive pillar over the redistribution layer, the conductive pillar having an annular shape in a plan view, wherein the annular shape comprises two holes and a divider separating the two holes.
2. The structure of claim 1, further comprising an insulating material in physical contact with an inner sidewall of the conductive pillar.
3. The structure of claim 2, wherein the insulating material is a polymer material.
4. The structure of claim 2, wherein the insulating material is a molding compound.

5. The structure of claim 1, wherein the divider of the annular shape is aligned in a direction of a coefficient of thermal expansion (CTE) mismatch.

6. The structure of claim 1, further comprising a solder layer in physical contact with a topmost surface of the conductive pillar.

7. The structure of claim 1, wherein the conductive pillar is in electrical contact with the redistribution layer.

8. A structure comprising:
    a substrate;
    a redistribution layer over the substrate; and
    a conductive pillar in electrical contact with the redistribution layer, the conductive pillar having a shape of a cylindrical shell, the cylindrical shell having a divider extending from a first portion of an inside sidewall of the cylindrical shell to a second portion of the inside sidewall of the cylindrical shell.

9. The structure of claim 8, further comprising a molding compound partially filling the cylindrical shell.

10. The structure of claim 8, wherein the divider of the cylindrical shell is aligned in a direction of a coefficient of thermal expansion (CTE) mismatch.

11. The structure of claim 8, further comprising a contact pad between the substrate and the redistribution layer, the redistribution layer electrically coupling the contact pad to the conductive pillar.

12. The structure of claim 11, further comprising a passivation layer between the contact pad and the redistribution layer.

13. The structure of claim 8, further comprising a solder layer over the conductive pillar.

14. The structure of claim 8, further comprising a polymer material partially filling the cylindrical shell.

15. A structure comprising:
    a substrate;
    a contact pad over the substrate;
    a passivation layer over the contact pad;
    a redistribution layer over the passivation layer, a portion of the redistribution layer extending through the passivation layer and contacting the contact pad; and
    a conductive pillar in physical contact with the redistribution layer, the conductive pillar having a shape of a hollow cylinder, the hollow cylinder having a divider extending from a first portion of an inside sidewall of the hollow cylinder to a second portion of the inside sidewall of the hollow cylinder.

16. The structure of claim 15, further comprising an insulating material in physical contact with the inside sidewall of the hollow cylinder.

17. The structure of claim 16, wherein a portion of the conductive pillar extends above a topmost surface of the insulating material.

18. The structure of claim 15, further comprising a solder layer over the conductive pillar.

19. The structure of claim 15, wherein the passivation layer comprises a dielectric material.

20. The structure of claim 15, wherein the passivation layer comprises a polymer material.

\* \* \* \* \*